United States Patent (10) Patent No.: US 8,604,845 B2
Lee et al. (45) Date of Patent: Dec. 10, 2013

(54) TRIANGULAR WAVE GENERATOR AND METHOD GENERATING TRIANGULAR WAVE THEREOF

(75) Inventors: Hui Dong Lee, Daejeon (KR); Jaewon Nam, Daejeon (KR); Young Kyun Cho, Daejeon (KR); Jong-Kee Kwon, Daejeon (KR); Yil Suk Yang, Daejeon (KR); Jongdae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 16 days.

(21) Appl. No.: 13/488,337

(22) Filed: Jun. 4, 2012

(65) Prior Publication Data

US 2013/0027094 A1 Jan. 31, 2013

(30) Foreign Application Priority Data

Jul. 25, 2011 (KR) .......................... 10-2011-0073670

(51) Int. Cl.
*H03K 4/06* (2006.01)

(52) U.S. Cl.
USPC .............................. 327/131; 327/134; 327/140

(58) Field of Classification Search
None
See application file for complete search history.

(56) References Cited

U.S. PATENT DOCUMENTS

| 4,516,036 | A  | * | 5/1985 | Miller | ............................ | 327/135 |
|---|---|---|---|---|---|---|
| 4,672,325 | A  | * | 6/1987 | Murai | .............................. | 327/135 |
| 5,387,882 | A  | * | 2/1995 | Schoofs | ........................ | 331/111 |
| 5,760,623 | A  | * | 6/1998 | Hastings | ........................ | 327/137 |
| 7,388,413 | B1 | * | 6/2008 | Ball | ................................ | 327/131 |
| 7,863,992 | B2 | * | 1/2011 | Chung | ........................... | 331/111 |
| 7,978,170 | B2 |   | 7/2011 | Park et al. |   |   |
| 2003/0141907 | A1 | * | 7/2003 | Canova et al. | ................. | 327/131 |
| 2010/0039571 | A1 | * | 2/2010 | Hagino et al. | ................. | 348/751 |

FOREIGN PATENT DOCUMENTS

| KR | 10-0207544 B1 | 7/1999 |
|---|---|---|
| KR | 10-2007-0060489 A | 6/2007 |
| KR | 10-0786845 B1 | 12/2007 |
| KR | 10-1042235 B1 | 6/2011 |

* cited by examiner

*Primary Examiner* — Tuan T Lam

(57) ABSTRACT

Disclosed is a triangular wave generator which includes a square wave signal generating unit configured to output a first signal transitioning to a high level from a low level via an output terminal in response to a first transition of a clock signal and to transition the first signal to a low level from a high level in response to a reset signal; a resistance unit configured to adjust a voltage level of a the square wave signal; and a capacitance unit configured to receive an output signal of the resistance unit to generate a second signal rising to a high level from a low level with a slope, to provide the reset signal to the square wave signal generating unit, and to output a triangular signal by falling the second signal to a low level from a high level with a slope.

16 Claims, 13 Drawing Sheets

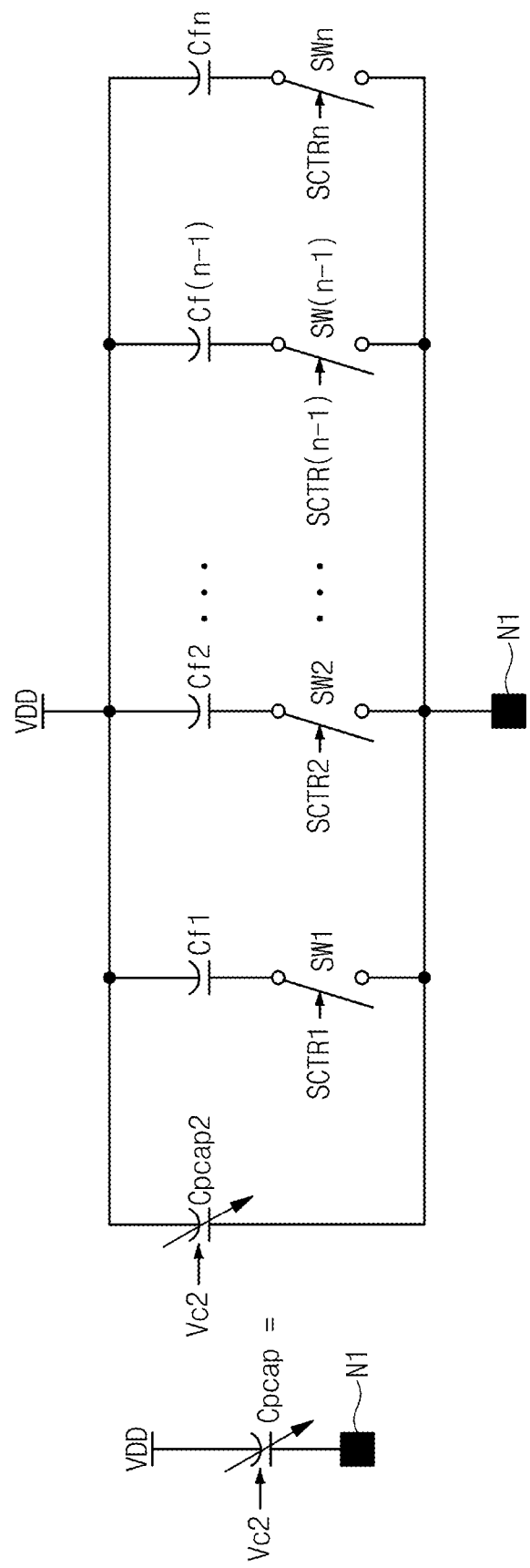

TRIANGULAR WAVE GENERATOR AND METHOD GENERATING TRIANGULAR WAVE THEREOF

CROSS-REFERENCE TO RELATED APPLICATIONS

A claim for priority under 35 U.S.C. §119 is made to Korean Patent Application No. 10-2011-0073670 filed Jul. 25, 2011, in the Korean Intellectual Property Office, the entire contents of which are hereby incorporated by reference.

BACKGROUND

The inventive concepts described herein relate to a signal generator, and more particularly, relate to a simplified triangular wave generator and a triangular wave generating method thereof.

A signal generator may be a device which periodically generates an AC signal. The signal generator may generate AC signals such as a sine wave, a square wave, a triangular wave, a saw-tooth wave, and the like, and its shape may be different according to a frequency and amplitude.

Among signal generators, a signal generator generating a triangular wave signal may be referred to as a triangular wave generator. The triangular wave generator may generate an input waveform of a digital circuit. This may enable it to be used to analyze a digital circuit or to generate a sweep signal (e.g., a signal having a bendy direction) at a deflection circuit.

The triangular wave generator may generate a triangular wave signal by charging or discharging capacitors, for example. The triangular wave generator may include current sources for charging or discharging and comparators (e.g., formed of amplifiers) for detecting an upper peak value and a lower peak value of a triangular wave signal. Besides, the triangular wave generator may necessitate elements such as a switch for connecting or disconnecting current sources to or from capacitors to control charging or discharging of capacitors, a flip-flop controlling an operation of the switch based on output values of the comparators, and the like.

Due to many elements, the triangular wave generator may need control signals for controlling currents of the current sources and control voltages to be provided to the comparators as a reference voltage.

As many elements and control signals (or, control voltages) are required to generate a triangular wave, the triangular wave generator may be complicated and cause an increase in a chip size.

SUMMARY

Example embodiments of the inventive concept provide a triangular wave generator which comprises a square wave signal generating unit configured to output a first signal transitioning to a high level from a low level via an output terminal in response to a first transition of a clock signal input via a clock terminal and to transition the first signal to a low level from a high level in response to a reset signal input via a reset terminal to output a square wave signal via an output terminal; a resistance unit configured to adjust a voltage level of a signal of the output terminal; and a capacitance unit configured to receive an output signal of the resistance unit to generate a second signal rising to a high level from a low level with a slope, to provide the reset signal generated from the second signal to the square wave signal generating unit, and to output a triangular signal by falling the second signal to a low level from a high level with a slope.

In example embodiments, the square wave signal generating unit further includes an input terminal supplied with a power supply voltage.

In example embodiments, the square wave signal generating unit includes the clock terminal, the input terminal, the reset terminal, and the output terminal.

In example embodiments, the resistance unit includes a transistor having a drain connected to the square wave signal generating unit, a source connected to the capacitance unit, and a gate connected to receive a first control signal.

In example embodiments, the resistance unit includes a variable resistor controlling a voltage level of the square wave signal in response to a first control signal.

In example embodiments, the capacitance unit includes at least one capacitor connected to the output terminal outputting the triangular wave signal.

In example embodiments, the capacitance unit comprises a first capacitor connected to the output terminal and a power terminal and configured to charge and discharge a voltage-controlled square wave signal in response to a second control signal; and a second capacitor connected to the output terminal and a ground terminal and configured to charge and discharge the voltage-controlled square wave signal in response to a third control signal.

In example embodiments, the capacitance unit comprises a plurality of capacitors connected in parallel between the output terminal and a power terminal and configured to charge and discharge a voltage-controlled square wave signal; and at least one switch connected to a part of the plurality of capacitors, respectively, and configured to control a charge capacity in response to a switch control signal.

In example embodiments, the capacitance unit comprises a plurality of capacitors connected in parallel between the output terminal and a ground terminal and configured to charge and discharge a voltage-controlled square wave signal; and at least one switch connected to a part of the plurality of capacitors, respectively, and configured to control a charge capacity in response to a switch control signal.

In example embodiments, the triangular wave generator further comprises an inverter unit placed between the capacitance unit and the square wave signal generating unit and configured to invert the second signal to generate the reset signal.

In example embodiments, the triangular wave generator further comprises a buffer unit configured to receive the square wave signal and to invert the square wave signal to output at least one inverting signal.

In example embodiments, the buffer unit comprises a first inverter configured to receive the square wave signal and to invert the square wave signal to output a first inverting signal; and a second inverter configured to receive the first inverting signal and to invert the first inverting signal to output a second inverting signal.

In example embodiments, the triangular wave generator further comprises an amplification unit configured to amplify and output the triangular wave signal.

Example embodiments of the inventive concept provide a triangular wave generating method of a triangular wave generator which includes a square wave signal generating unit has an input terminal, a clock terminal, a reset terminal, and an output terminal. The triangular wave generating method comprises outputting a first signal transitioning to a high level from a low level via the output terminal in response to a first transition of a clock signal input via the clock terminal; receiving the first signal to generate a second signal rising to a high level from a low level with a slope; receiving the second signal to generate a reset signal; transitioning the first signal to a low level from a high level in response to a reset signal input via the reset terminal to output a square wave signal via an output terminal; and receiving the square wave signal and outputting a triangular signal by falling the second signal to a low level from a high level with a slope.

In example embodiments, the reset signal is generated using a second signal which has a voltage level adjusted by a first control signal.

In example embodiments, the triangular wave signal is output using the square wave signal which has a voltage level controlled by a first control signal.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 3C is a diagram schematically illustrating a capacitor in FIG. 1 according to still another embodiment of the inventive concept.

DETAILED DESCRIPTION

Figure 1:
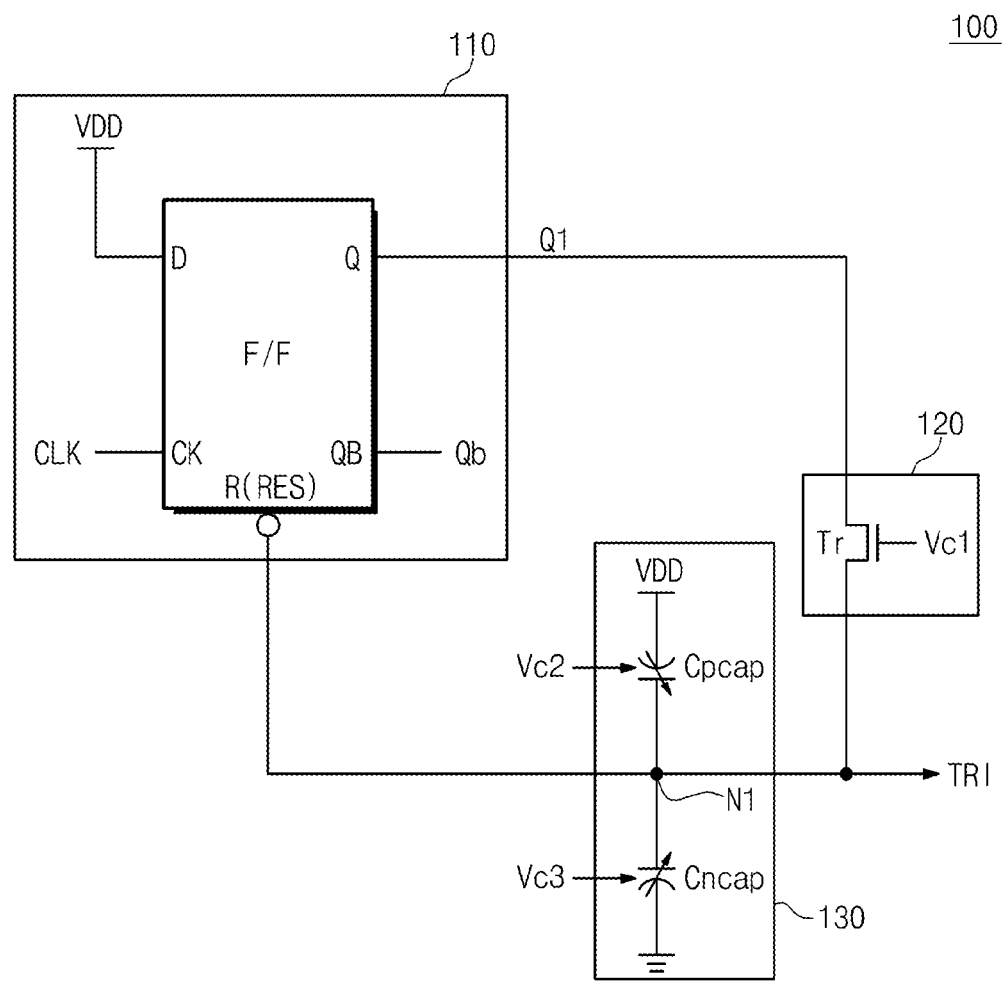
FIG. 1 is a block diagram schematically illustrating a triangular wave generator according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a triangular wave generator according to an embodiment of the inventive concept.

Referring to FIG. 1, a triangular wave generator 100 may include a square wave signal generating unit 110, a resistance unit 120, and a capacitance unit 130.

The square wave signal generating unit 110 may generate a square wave signal Q1 for generation of a triangular wave signal TRI. In example embodiments, the triangular wave generator 100 can generate the square wave signal Q1 in response to a reset signal RES. Herein, the reset signal RES may be a signal for controlling an operating state of the square wave signal generating unit 110. The square wave signal generating unit 110 may respond to the reset signal RES to control an operation of generating the square wave signal Q1.

The square wave signal generating unit 110 may include a flip-flop F/F, for example. The flip-flop F/F may have an input terminal D, a clock terminal CK, a reset terminal R, a first output terminal Q, and a second output terminal QB. A power supply voltage VDD may be applied to the input terminal D, and a clock signal CLK may be applied to the clock terminal CK. The flip-flop F/F may output the square wave signal Q1 via the first output terminal Q in response to signals VDD, CLK, and RES input via the terminals D, CK, and R, respectively. Alternatively, a square wave signal Qb may be output from the second output terminal QB of the flip-flop F/F.

The flip-flop F/F may be reset by the reset signal RES having a logical high state. Herein, the reset signal RES may be a signal having a logical high state over a threshold level for a reset operation of the flip-flop F/F. That is, the flip-flop may be reset when the reset signal RES for activating a reset operation is applied to the reset terminal R. If the reset signal is input, the flip-flop F/F may generate the square wave signal Q1 having a logical low state until the clock signal CLK is input.

Also, when a reset signal not activating a reset operation is input, the flip-flop F/F may generate the square wave signal Q1 having a logical high state. For example, the flip-flop F/F may be a D flip-flop that is reset by the reset signal RES having a logical high state.

The resistance unit 120 may be connected between the square wave signal generating unit 110 and the capacitance unit 130. The resistance unit 120 may adjust a voltage level of the square wave signal Q1. The resistance unit 120 may vary a voltage level of the square wave signal Q1 in response to a resistance control signal Vc1. The resistance unit 120 may output a voltage-controlled square wave signal Q1.

The resistance unit 120 may include a transistor Tr, for example. A drain of the transistor Tr may be connected to the square wave signal generating unit 110, and a source thereof may be connected to the capacitance unit 130. The square wave signal Q1 may be applied to the drain of the transistor Tr, and the resistance control signal Vc1 may be applied to a gate of the transistor Tr. For example, the transistor Tr may be an NMOS transistor. A resistance value of the transistor Tr may be varied by the resistance control signal Vc1, and a resistance value may be applied to the square wave signal Q1.

The transistor Tr may provide the square wave signal Q1 to the capacitance unit 130 in response to the resistance control signal Vc1. Herein, the transistor Tr may operate at a linear region, and may have a channel resistance Ron at the linear region.

The transistor Tr may change a charging point of time and a discharging point of time of capacitors according to the resistance control signal Vc1 applied to its gate. The higher a voltage of the resistance control signal Vc1 becomes, the lower a channel resistance value of the transistor Tr becomes. The lower a voltage of the resistance control signal Vc1 becomes, the higher a channel resistance value of the transistor Tr becomes. Therefore, a channel resistance value of the transistor Tr may be varied according to the resistance control signal Vc1. Herein, the transistor Tr can be formed of a PMOS transistor. In this case, the PMOS transistor may operate on the contrary to the NMOS transistor. The capacitance unit 130 may generate the triangular wave signal TRI by the square wave signal Q1 according to the resistance value of which is controlled. For example, the capacitance unit 130 may include variable capacitors Cpcap and Cncap. The capacitance unit 130 may receive the square wave signal Q1 output from the transistor Tr connected to an output node (or, referred to as a first node) N1.

The first variable capacitor Cpcap and the second variable capacitor Cncap may be connected via the first node N1. The first variable capacitor Cpcap may be placed between a power terminal and the first node N1, and the second variable capacitor Cncap may be placed between the first node N1 and a ground terminal.

The first variable capacitor Cpcap and the second variable capacitor Cncap may be charged or discharged according to the voltage-controlled square wave signal Q1. The triangular wave signal TRI may be output from the first node N1 being the output node by charging or discharging of the variable capacitors Cpcap and Cncap.

The first variable capacitor Cpcap and the second variable capacitor Cncap may be supplied with capacitor control signals Vc2 and Vc3 for varying a charge capacity, respectively. Charge capacities of the first and second variable capacitors Cpcap and Cncap may be controlled by the capacitor control signals Vc2 and Vc3, respectively.

Also, the first variable capacitor Cpcap and the second variable capacitor Cncap may generate the reset signal RES for controlling an operation of the square wave signal generating unit 110.

The capacitance unit 130 can be formed of at least one capacitor connected to the output node (e.g., the first node N1). For example, the capacitance unit 130 can be formed of the first variable capacitor Cpcap or the second variable capacitor Cncap.

Also, the first variable capacitor Cpcap and the second variable capacitor Cncap can be connected in parallel with the first node N1. A capacitor of the capacitance unit 130 may be formed of a metal insulator metal (MIM) capacitor, a junction capacitor, or a metal oxide semiconductor field effect transistor (MOSFET).

The capacitance unit 130 may generate the triangular wave signal TRI at the output node via charging or discharging of capacitors. That is, the capacitance unit 130 may perform a charge operation according to a square wave signal having a high state and a discharge operation according to a square wave signal having a low state. Thus, the capacitance unit 130 may output the triangular wave signal TRI a rising period of which is generated by the charge operation and a falling period of which is generated by the discharge operation.

The capacitance unit 130 may be configured to have a constant capacitance value using additional variable resistors or resistors or transistors.

A control unit (not shown) generating the resistance control signal Vc1 and the capacitor control signals Vc2 and Vc3 may be placed at the inside or outside of the triangular wave generator 100. In example embodiments, the control signals Vc1, Vc2, and Vc3 may be voltage signals.

The square wave signal Q1 may have a logical value of a logical high or low state. When the square wave signal Q1 has a logical high state, the triangular wave signal TRI having a positive slope may be generated by charging of the capacitance unit 130. When the square wave signal Q1 has a logical low state, the triangular wave signal TRI having a negative slope may be generated by discharging of the capacitance unit 130.

As illustrated in FIG. 1, it is possible to make the triangular wave generator 100 with a simple structure. The triangular wave generator 100 may include the square wave signal generating unit 110, the resistance unit 120, and the capacitance unit 130. The square wave signal generating unit 110 may include a flip-flop, the resistance unit 120 may include a transistor, and the capacitance unit 130 may include variable capacitors Cncap and Cpcap. As a result, it is possible to configure a simplified triangular wave generator 100 using elements a flip-flop, a transistor, and variable capacitors. Also, a chip size may be minimized when the simplified triangular wave generator 100 is integrated.

Figure 2:
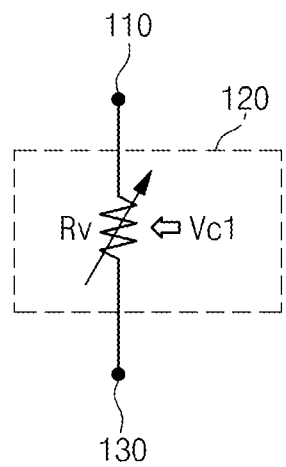
FIG. 2 is a diagram schematically illustrating a resistance unit according to another embodiment of the inventive concept.

FIG. 2 is a diagram schematically illustrating a resistance unit according to another embodiment of the inventive concept.

Referring to FIG. 2, a resistance unit 120 may include a variable resistor Rv instead of a transistor Tr. A resistance value of the variable resistor Rv may be varied by a resistance control signal Vc1. The variable resistor Rv may adjust a voltage level of a square wave signal Q1 to output it to a capacitance unit 130.

The higher a voltage of the resistance control signal Vc1 becomes, the higher a resistance value of the variable resistor Rv becomes. The lower a voltage of the resistance control signal Vc1 becomes, the lower a resistance value of the variable resistor Rv becomes. However, the variable resistor Rv can be configured such that is decreased when a voltage of the resistance control signal Vc1 increases and is increased when a voltage of the resistance control signal Vc1 decreases.

Figure 3A:
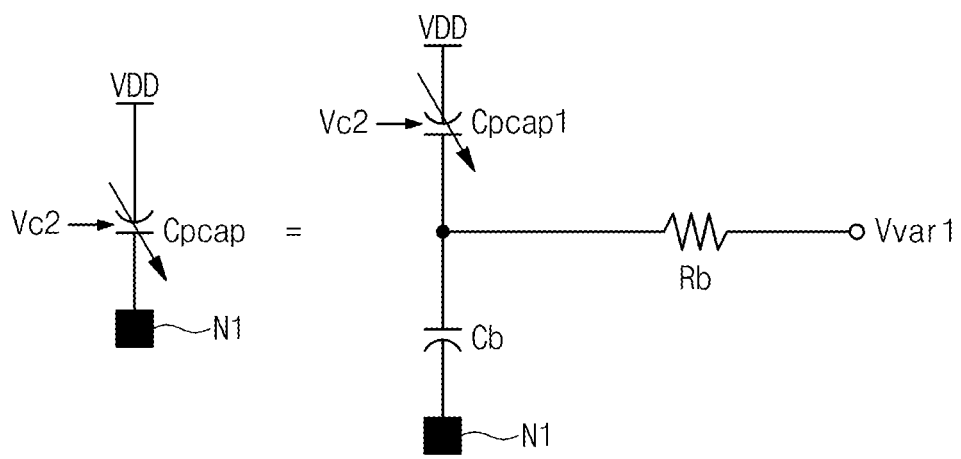
FIG. 3A is a diagram schematically illustrating a capacitance unit in FIG. 1 according to an embodiment of the inventive concept.

FIG. 3A is a diagram schematically illustrating a capacitance unit in FIG. 1 according to an embodiment of the inventive concept.

Referring to FIG. 3A, a capacitance unit 130 may include a first variable capacitor Cpcap. A circuit of the first variable capacitor Cpcap may be equivalent to a circuit including capacitors Cb and Cpcap1 and a resistor Rb.

The first capacitor Cpcap1 and the second capacitor Cb may be connected between a power terminal and a first node N1. The resistor Rb may be connected to a connection node between the first capacitor Cpcap1 and the second capacitor Cb, and a first variable voltage Vvar1 may be applied to the resistor Rb. Herein, the second capacitor Cb and the resistor Rb may remove a DC component.

A capacitance value of the first capacitor Cpcap1 may be adjusted by the first variable voltage Vvar1 applied to the resistor Rb.

A capacitance value of the first variable capacitor Cpcap may be controlled by a capacitance control signal Vc2. The first capacitor Cpcap1 may be controlled by the capacitance control signal Vc2 like the first variable capacitor Cpcap.

Figure 3B:
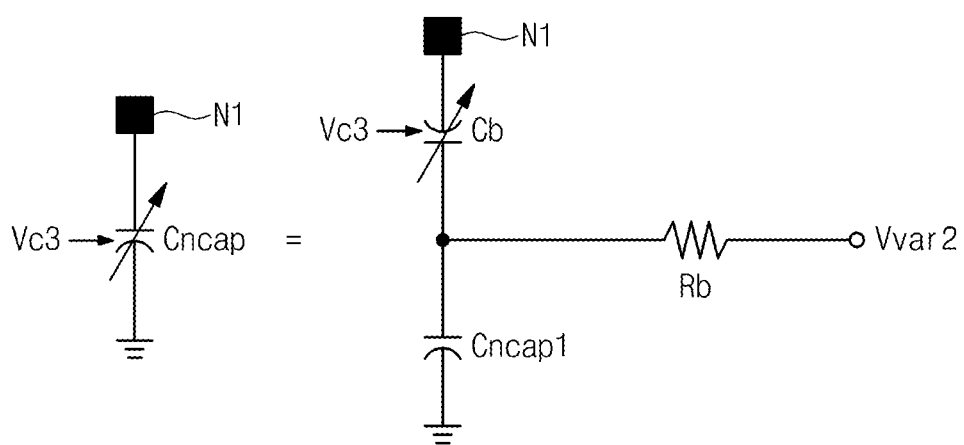
FIG. 3B is a diagram schematically illustrating a capacitance unit in FIG. 1 according to another embodiment of the inventive concept.

FIG. 3B is a diagram schematically illustrating a capacitance unit in FIG. 1 according to another embodiment of the inventive concept.

Referring to FIG. 3B, a capacitance unit 130 may include a second variable capacitor Cncap. A circuit of the second variable capacitor Cncap may be equivalent to a circuit including capacitors Cb and Cncap1 and a resistor Rb.

The first capacitor Cncap1 and the second capacitor Cb may be connected between a first node N1 and a ground terminal. The resistor Rb may be connected to a connection node between the first capacitor Cncap1 and the second capacitor Cb, and a second variable voltage Vvar2 may be applied to the resistor Rb. Herein, the second capacitor Cb and the resistor Rb may remove a DC component.

A capacitance value of the first capacitor Cncap1 may be adjusted by the second variable voltage Vvar2 applied to the resistor Rb.

A capacitance value of the second variable capacitor Cncap may be controlled by a capacitance control signal Vc3. The first capacitor Cncap1 may be controlled by the capacitance control signal Vc3 like the second variable capacitor Vncap.

FIG. 3C is a diagram schematically illustrating a capacitor in FIG. 1 according to still another embodiment of the inventive concept.

Referring to FIG. 3C, a capacitor unit 130 may include a first variable capacitor Cpcap. A circuit of the first variable capacitor Cpcap may be equivalent to such a circuit that capacitors Cpcap2 and Cf1 to Cfn are interconnected in parallel.

The first variable capacitor Cpcap may include a plurality of capacitors Cpcap2 and Cf1 to Cfn connected in parallel between a power terminal and a first node N1.

The capacitor Cpcap2 and the capacitors Cf1 to Cfn may be charged or discharged according to a square wave signal Q1.

Switches SW1 to SWn may be connected to the capacitors Cf1 to Cfn, respectively. For example, a first switch SW1 may be connected to the capacitor Cf1, a second switch SW2 may be connected to the capacitor Cf2, a (n−1)th switch SWn−1 may be connected to the capacitor Cf(n−1), and an nth switch SWn may be connected to the capacitor Cfn.

The switches SW1 to SWn may be controlled by switch control signals SCTR1 to SCTRn, respectively. A charge capacity of the first capacitor Cpcap2 may be controlled variously by selecting turning on the switches SW1 to SWn according to corresponding switch control signals.

A charge capacity can be controlled by adjusting (increasing/decreasing) the number of capacitors Cf1 to Cfn. Capacitance values of the capacitors Cf2 to Cfn may gradually increase or decrease on the basis of the capacitor Cf1. For example, when a capacitance value of the capacitor Cf1 is Cunit, the capacitor Cf3 may be set to have a value of Cunit/2, and the capacitor Cfn may be set to have a value of $Cunit/2^{(n-1)}$. Also, a part or all of the capacitors Cf1 to Cfn can be set to have the same capacitance value.

A capacitance value of the first variable capacitor Cpcap may be controlled by a capacitance control signal Vc2. The first capacitor Cpcap2 may be controlled by the capacitance control signal Vc2 like the first variable capacitor Cpcap.

Figure 3D:
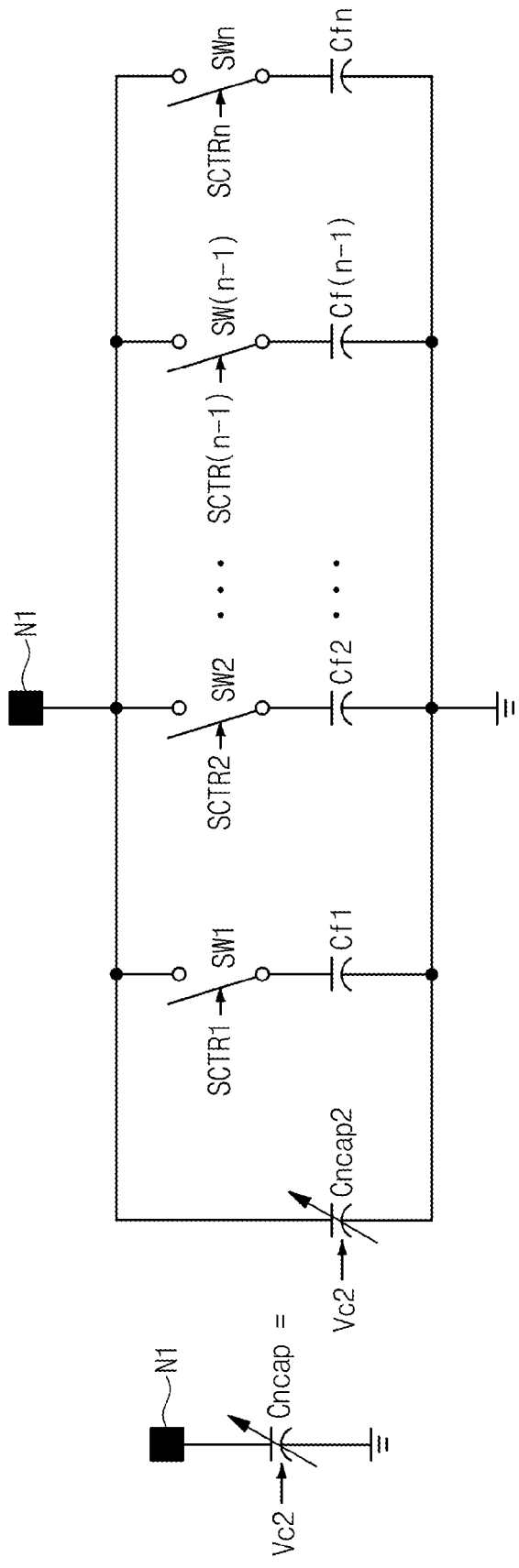
FIG. 3D is a diagram schematically illustrating a capacitor in FIG. 1 according to another embodiment of the inventive concept.

FIG. 3D is a diagram schematically illustrating a capacitor in FIG. 1 according to another embodiment of the inventive concept.

Referring to FIG. 3D, a capacitor unit 130 may include a second variable capacitor Cncap. A circuit of the second variable capacitor Cncap may be equivalent to such a circuit that capacitors Cncap2 and Cf1 to Cfn are interconnected in parallel.

The second variable capacitor Cncap may include a plurality of capacitors Cncap2 and Cf1 to Cfn connected in parallel between a first node N1 and a ground terminal.

The capacitor Cncap and the capacitors Cf1 to Cfn may be charged or discharged according to a square wave signal Q1.

Switches SW1 to SWn may be connected to the capacitors Cf1 to Cfn, respectively. For example, a first switch SW1 may be connected to the capacitor Cf1, a second switch SW2 may be connected to the capacitor Cf2, a (n−1)th switch SWn−1 may be connected to the capacitor Cf(n−1), and an nth switch SWn may be connected to the capacitor Cfn.

The switches SW1 to SWn may be controlled by switch control signals SCTR1 to SCTRn, respectively. A charge capacity of the first capacitor Cncap2 may be controlled variously by selecting turning on the switches SW1 to SWn according to corresponding switch control signals.

A charge capacity can be controlled by adjusting (increasing/decreasing) the number of capacitors Cf1 to Cfn. Capacitance values of the capacitors Cf2 to Cfn may gradually increase or decrease on the basis of the capacitor Cf1. For example, when a capacitance value of the capacitor Cf1 is Cunit, the capacitor Cf3 may be set to have a value of Cunit/2, and the capacitor Cfn may be set to have a value of $Cunit/2^{(n-1)}$. Also, a part or all of the capacitors Cf1 to Cfn can be set to have the same capacitance value.

A capacitance value of the second variable capacitor Cncap may be controlled by a capacitance control signal Vc3. The first capacitor Cncap2 may be controlled by the capacitance control signal Vc3 like the second variable capacitor Cncap.

In FIGS. 3C and 3D, capacitors in the first or second variable capacitors Cpcap or Cncap may be charged or discharged according to a square wave signal Q1. A triangular wave signal TRI may be output from the first node N1 being an output node by charging or discharging the variable capacitors Cpcap1, Cncap1, Cpcap2 and Cncap2.

Figure 4A:
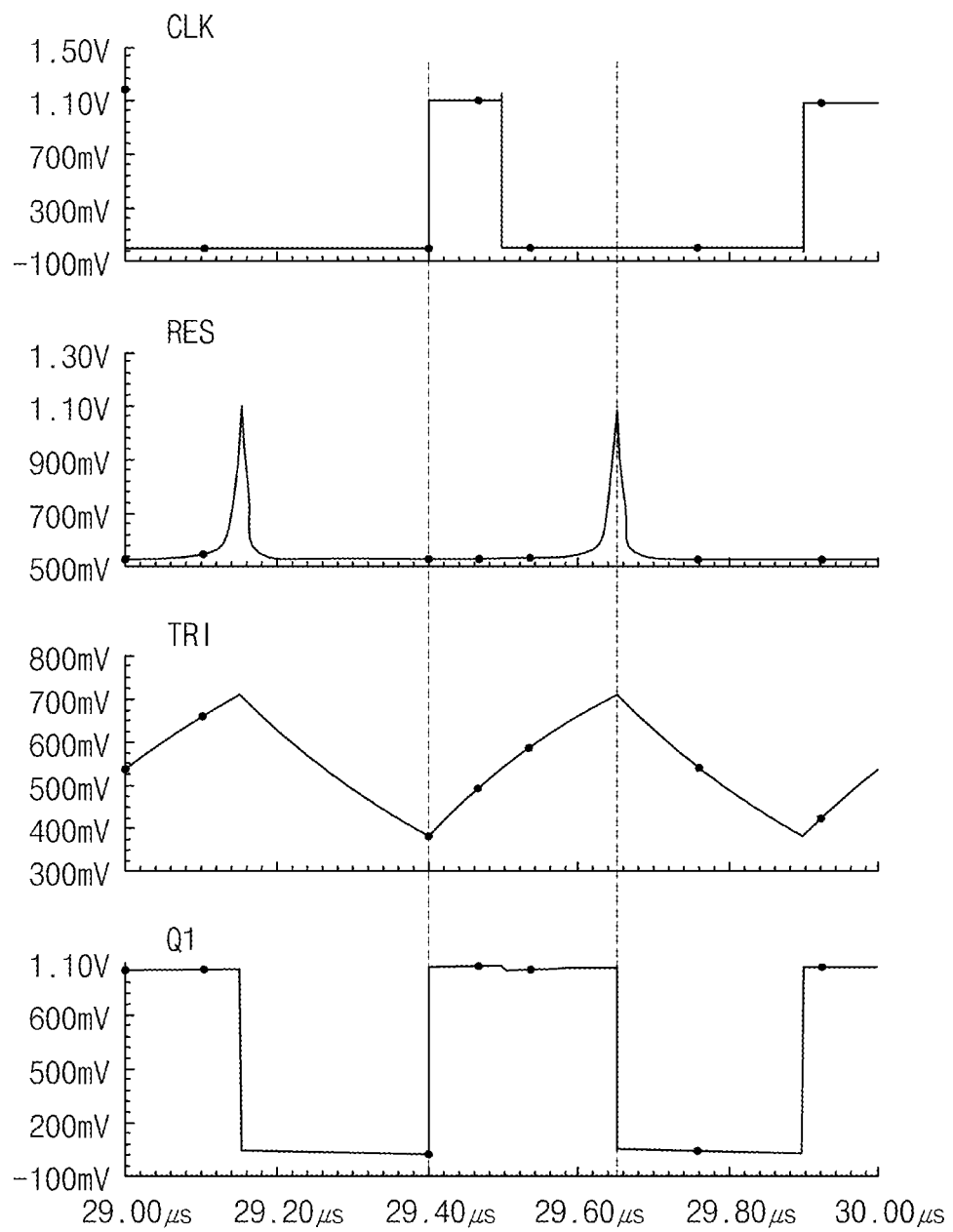
FIG. 4A is a waveform diagram illustrating signals of a triangular wave generator in FIG. 1 when a duty ratio of a clock signal is about 30%.

FIG. 4A is a waveform diagram illustrating signals of a triangular wave generator in FIG. 1 when a duty ratio of a clock signal is about 30%.

Referring to FIG. 4A, there are illustrated a square wave signal Q1, a triangular wave signal TRI, and a reset signal RES generated at a triangular wave generator 100. Also, a clock signal CLK provided to the triangular wave generator 100 is illustrated in FIG. 4A.

Herein, a duty ratio of the clock signal CLK may be about 30%.

A flip-flop F/F may output a square wave signal Q1 having a logical high state. The square wave signal Q1 may go to a logical high state at a rising edge of the clock signal CLK. When the square wave signal Q1 is at a logical high state, the triangular wave signal TRI having an increasing slope may be generated by charging of variable capacitors Cpcap and Cncap.

When charged up to a threshold voltage, the variable capacitors Cpcap and Cncap may generate the reset signal RES having a logical high state. The reset signal RES may be provided to a reset terminal R of the flip-flop F/F. The flip-flop F/F may be reset by the reset signal RES having a logical high state. Herein, since a point of time when the variable capacitors Cpcap and Cncap start to be charged is determined by the reset signal RES, it may operate regardless of a falling edge of the clock signal CLK.

The flip-flop F/F may output the square wave signal Q1 having a logical low state via the reset operation. When the square wave signal Q1 is at a logical low state, the triangular wave signal TRI having a decreasing slope may be generated by discharging of the variable capacitors Cpcap and Cncap.

If the flip-flop F/F is reset, it may output the square wave signal Q1 having a logical high state at a next rising edge of the clock signal CLK.

Figure 4B:
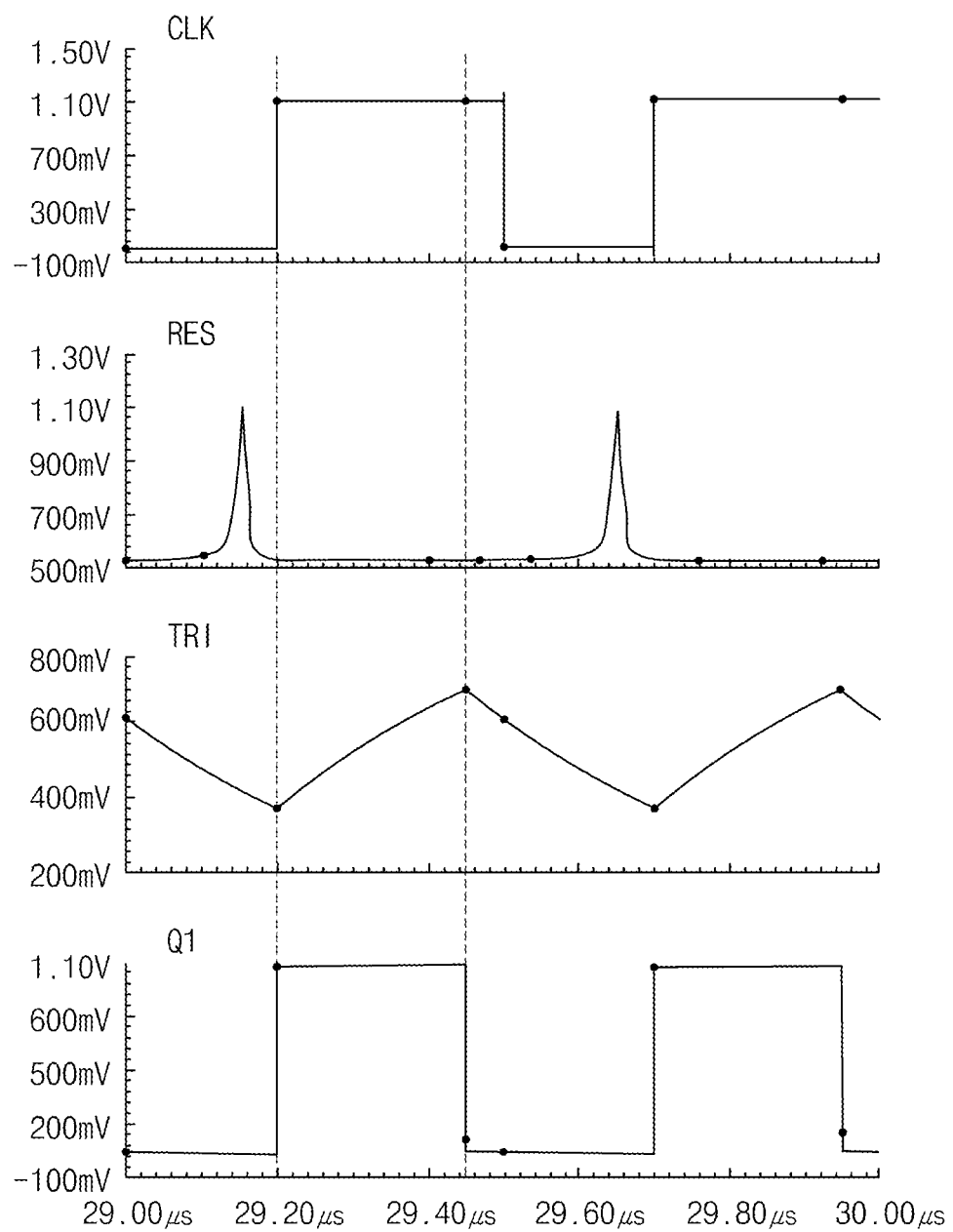
FIG. 4B is a waveform diagram illustrating signals of a triangular wave generator in FIG. 1 when a duty ratio of a clock signal is about 60%.

FIG. 4B is a waveform diagram illustrating signals of a triangular wave generator in FIG. 1 when a duty ratio of a clock signal is about 60%.

Referring to FIG. 4B, there are illustrated a square wave signal Q1, a triangular wave signal TRI, and a reset signal RES generated at a triangular wave generator 100. Also, a clock signal CLK provided to the triangular wave generator 100 is illustrated in FIG. 4B.

Herein, a duty ratio of the clock signal CLK may be about 60%. A clock signal CLK in FIG. 4B may have a duty ratio different from a clock signal CLK in FIG. 4A.

The signals Q1, TRI, and RES may be generated substantially the same as described in FIG. 4A except a clock signal CLK in FIG. 4B may have a duty ratio different from a clock signal CLK in FIG. 4A.

Like FIG. 4A, the square wave signal Q1 may go to a logical high state at a rising edge of the clock signal CLK. Also, since a point of time when variable capacitors Cpcap and Cncap start to be charged is determined by the reset signal RES, it may operate regardless of a falling edge of the clock signal CLK.

Referring to triangular wave signals TRI illustrated in FIGS. 4A and 4B, the square wave signal Q1 having a logical high state may be generated only at a rising edge of the clock signal CLK, so that a triangular wave generator 100 may generate a triangular wave signal TRI regardless of a duty ratio of the clock signal CLK.

Thus, as illustrated in FIGS. 4A and 4B, the triangular wave generator 100 may generate the square wave signal Q1 the duty ratio of which is about 50% regardless of an input clock signal CLK.

That is, although a clock signal CLK having any duty ratio is provided to the triangular wave generator 100 of the inventive concept, the square wave signal Q1 may go to a logical high state only at a rising edge of the clock signal CLK. Afterwards, the triangular wave generator 100 may determine a waveform of the square wave signal Q1 by charging and discharging of a capacitance unit 130. Thus, the triangular wave generator 100 of the inventive concept may generate the triangular wave signal TRI regardless of a duty ratio of the clock signal CLK.

The triangular wave generator 100 may be configured to change a size of a transistor Tr, capacities of variable capacitors Cpcap and Cncap, and charging or discharging points of time of variable capacitors Cpcap and Cncap according to a level of a resistance control signal Vc1. This may enable the triangular wave generator 100 to generate a triangular wave signal TRI having various duty ratios.

Figure 5:
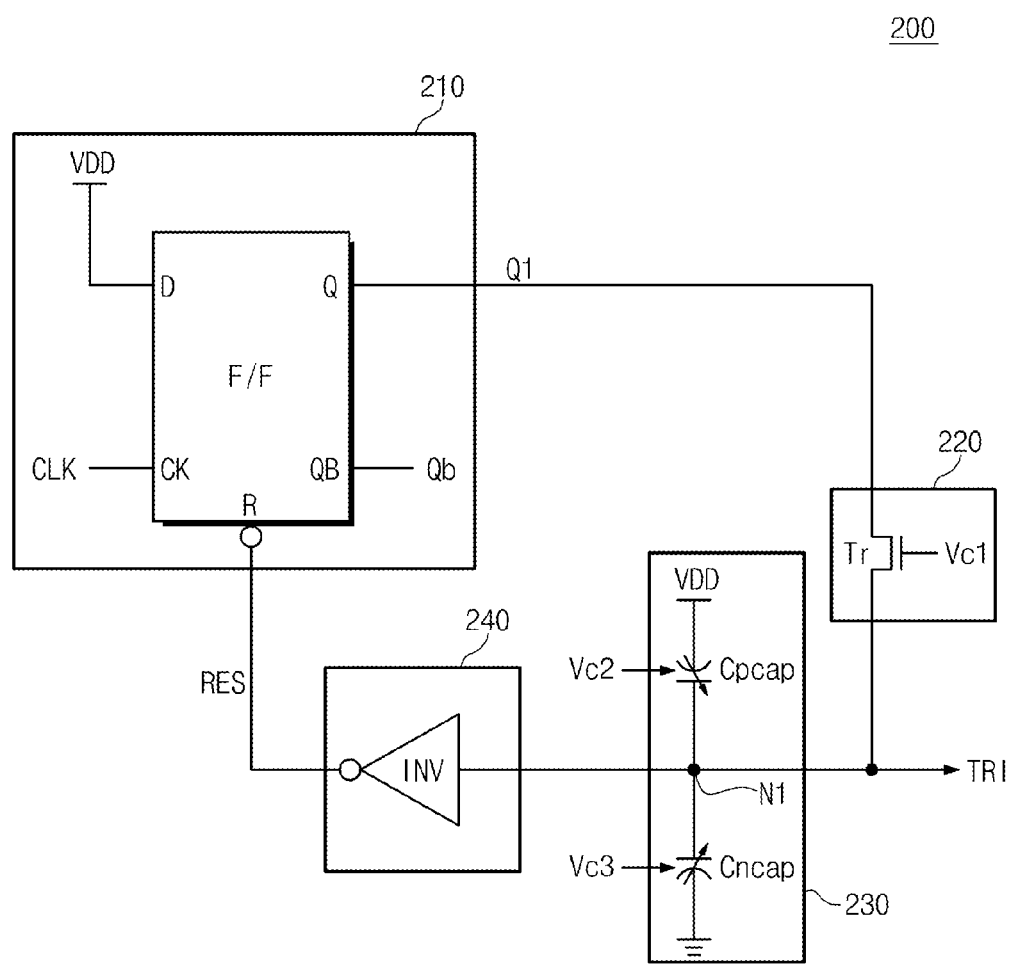
FIG. 5 is a block diagram schematically illustrating a triangular wave generator according to another embodiment of the inventive concept.

FIG. 5 is a block diagram schematically illustrating a triangular wave generator according to another embodiment of the inventive concept.

Referring to FIG. 5, a triangular wave generator 200 may include a square wave signal generating unit 210, a resistance unit 220, a capacitance unit 230, and an inverter unit 240.

Compared with a triangular wave generator 100 in FIG. 1, the triangular wave generator 200 may further include an inverter unit 240 that is configured to apply a reset signal RES of a logical low state to the square wave signal generating unit 210. The triangular wave generator 200 may be substantially the same as that in FIG. 1 except for the inverter unit 240, and description thereof is thus omitted.

The inverter unit 240 may be located between the capacitance unit 230 and the square wave signal generating unit 210. The inverter unit 240 may output the reset signal RES to the square wave signal generating unit 210 in response to a driving signal (e.g., a triangular wave signal TRI) from the capacitance unit 230.

For example, the inverter unit 240 may include an inverter INV. The inverter INV may output the reset signal RES to the square wave signal generating unit 210 when the driving signal has a level higher than an inverting threshold voltage for driving the inverter INV. Herein, a flip-flop F/F may be reset by the reset signal RES having a logical low state.

In example embodiments, the flip-flop F/F of the square wave signal generating unit 210 may be reset by the reset signal RES, having a logical low state, input to a reset terminal R. The flip-flop F/F may be formed of a D flip-flop F/F that is reset by the reset signal RES having a logical low state.

That is, a triangular wave signal generator 100 in FIG. 1 may include a square wave signal generating unit 110 having a flip-flop F/F that is reset by the reset signal RES having a logical high state. The triangular wave signal generator 200 in FIG. 5 may include a square wave signal generating unit 210 having a flip-flop F/F that is reset by the reset signal RES having a logical low state. Thus, the triangular wave signal generator 200 in FIG. 5 may have a simplified structure in which an inverter is added to a triangular wave generator 100 in FIG. 1.

Figure 6A:
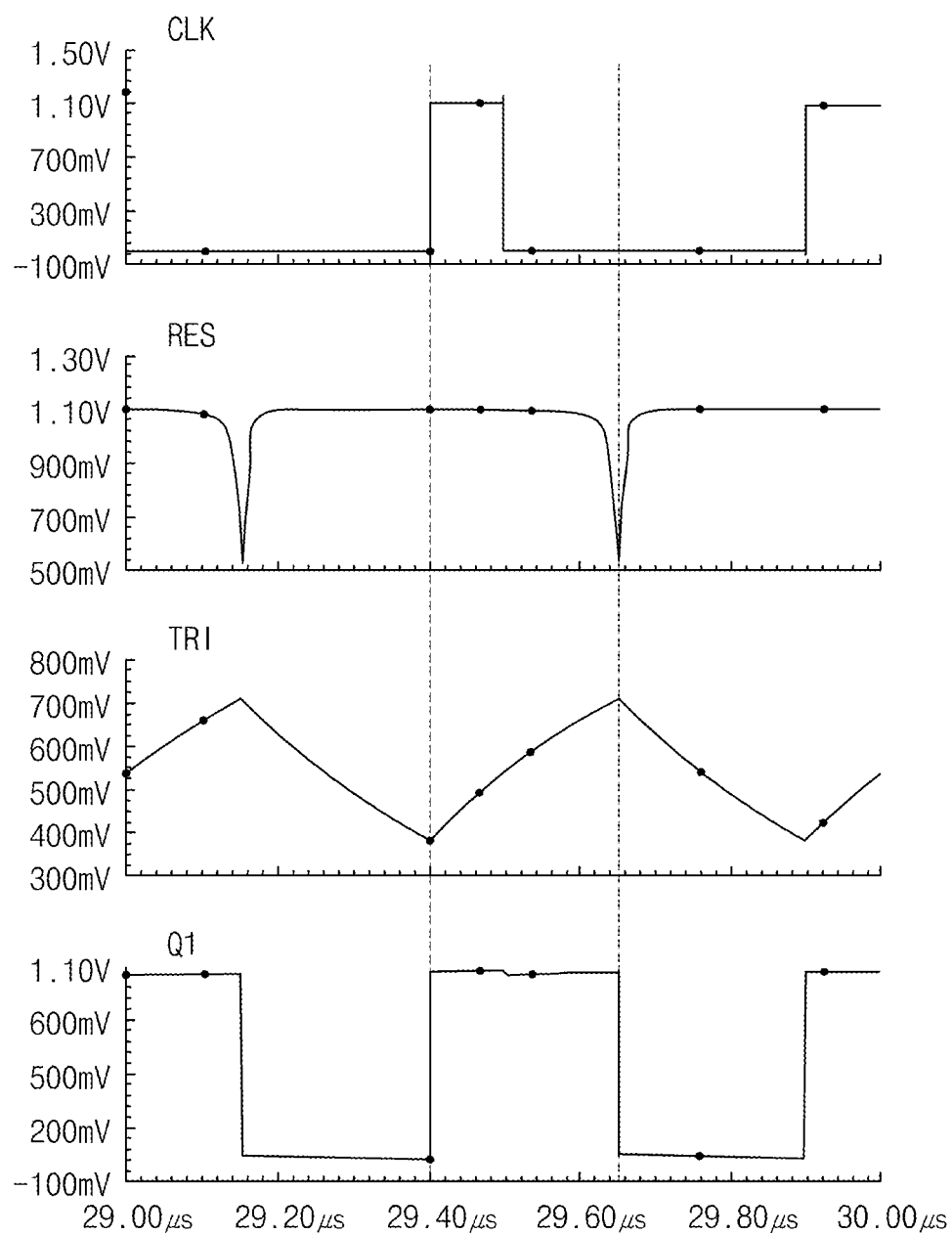
FIG. 6A is a waveform diagram illustrating signals of a triangular wave generator in FIG. 5 when a duty ratio of a clock signal is about 30%.

FIG. 6A is a waveform diagram illustrating signals of a triangular wave generator in FIG. 5 when a duty ratio of a clock signal is about 30%.

Referring to FIG. 6A, there are illustrated a square wave signal Q1, a triangular wave signal TRI, and a reset signal RES generated at a triangular wave generator 200. Also, a clock signal CLK provided to the triangular wave generator 200 is illustrated in FIG. 6A.

Herein, a duty ratio of the clock signal CLK may be about 30%.

A flip-flop F/F may output a square wave signal Q1 having a logical high state. The square wave signal Q1 may go to a logical high state at a rising edge of the clock signal CLK. When the square wave signal Q1 is at a logical high state, the triangular wave signal TRI having an increasing slope may be generated by charging of variable capacitors Cpcap and Cncap.

When charged up to a threshold voltage, the variable capacitors Cpcap and Cncap may generate a driving signal for driving an inverter INV.

When the driving signal is applied to the inverter INV, the reset signal RES having a logical low state may be provided to a reset terminal R of the flip-flop F/F. Herein, the reset signal RES may be a signal for resetting the flip-flop F/F. Herein, since a point of time when the variable capacitors Cpcap and Cncap start to be charged is determined by the reset signal RES, it may operate regardless of a falling edge of the clock signal CLK.

The flip-flop F/F may output the square wave signal Q1 having a logical low state via the reset operation. When the square wave signal Q1 is at a logical low state, the triangular wave signal TRI having a decreasing slope may be generated by discharging of the variable capacitors Cpcap and Cncap.

If the flip-flop F/F is reset, it may output the square wave signal Q1 having a logical high state at a next rising edge of the clock signal CLK.

Figure 6B:
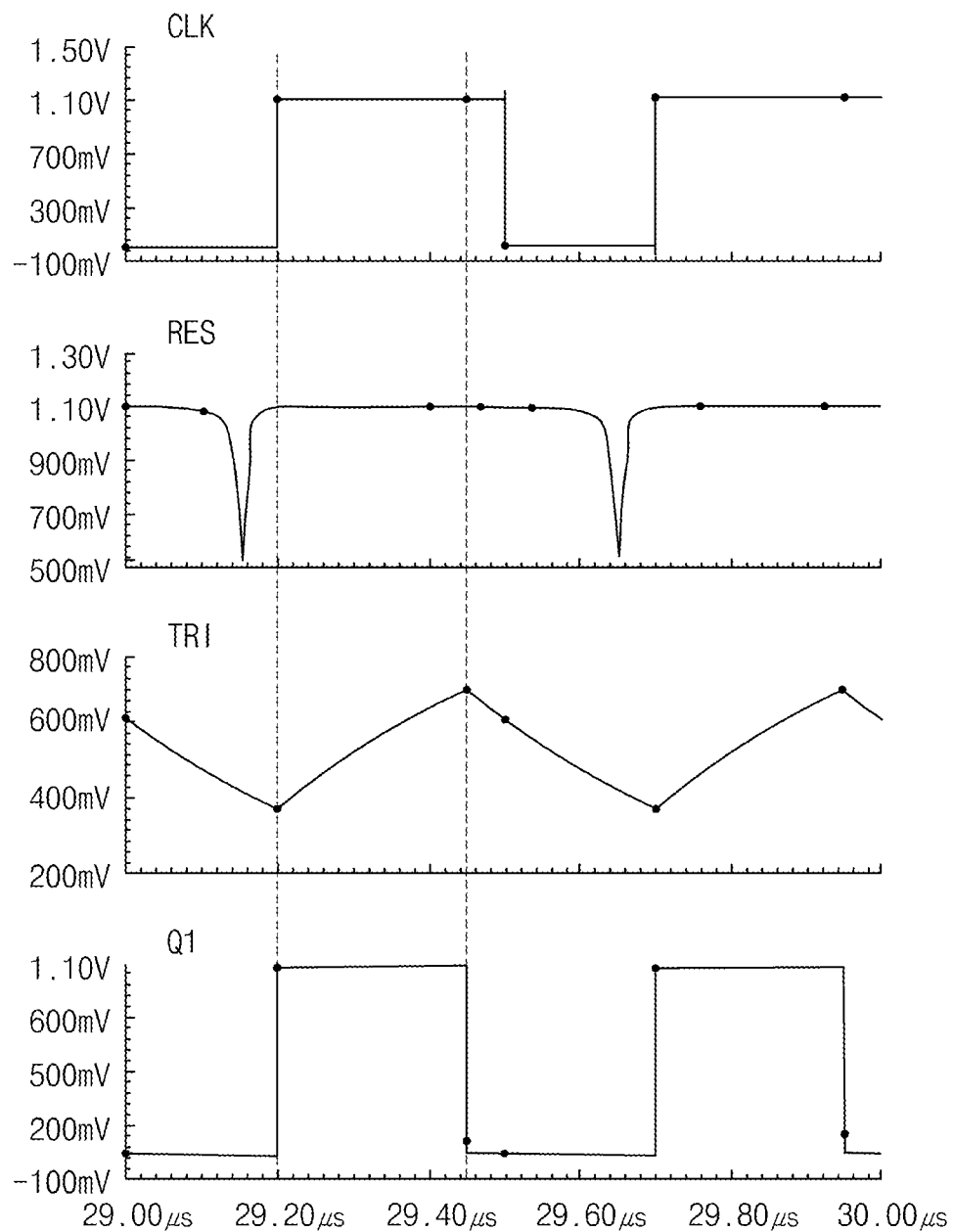
FIG. 6B is a waveform diagram illustrating signals of a triangular wave generator in FIG. 5 when a duty ratio of a clock signal is about 60%.

FIG. 6B is a waveform diagram illustrating signals of a triangular wave generator in FIG. 5 when a duty ratio of a clock signal is about 60%.

Referring to FIG. 6B, there are illustrated a square wave signal Q1, a triangular wave signal TRI, and a reset signal RES generated at a triangular wave generator 200. Also, a clock signal CLK provided to the triangular wave generator 200 is illustrated in FIG. 6B.

Herein, a duty ratio of the clock signal CLK may be about 60%. A clock signal CLK in FIG. 6B may have a duty ratio different from a clock signal CLK in FIG. 6A.

The signals Q1, TRI, and RES may be generated substantially the same as described in FIG. 6A except a clock signal CLK in FIG. 6B may have a duty ratio different from a clock signal CLK in FIG. 6A.

Like FIG. 6A, the square wave signal Q1 may go to a logical high state at a rising edge of the clock signal CLK. Also, since a point of time when variable capacitors Cpcap and Cncap start to be charged is determined by the reset signal RES, it may operate regardless of a falling edge of the clock signal CLK.

Referring to triangular wave signals TRI illustrated in FIGS. 6A and 6B, the square wave signal Q1 having a logical high state may be generated only at a rising edge of the clock signal CLK, so that a triangular wave generator 200 may generate a triangular wave signal TRI regardless of a duty ratio of the clock signal CLK.

Thus, as illustrated in FIGS. 6A and 6B, the triangular wave generator 200 may generate the square wave signal Q1 the duty ratio of which is about 50% regardless of an input clock signal CLK.

The triangular wave generator 100 may be configured to change a size of a transistor Tr, capacities of variable capacitors Cpcap and Cncap, charging or discharging points of time of variable capacitors Cpcap and Cncap according to a level of a resistance control signal Vc1, and charging or discharging points of time of variable capacitors Cpcap and Cncap according to a variation in an operating voltage of an inverter INV. This may enable the triangular wave generator 200 to generate a triangular wave signal TRI having various duty ratios.

Figure 7A:
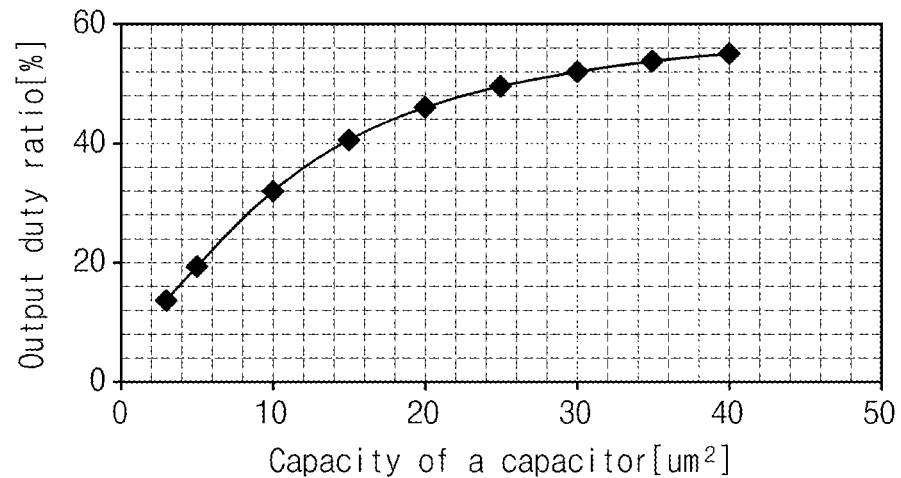
FIG. 7A is a graph illustrating an output duty ratio of a triangular wave according to control of variable capacitors in a triangular wave generator of the inventive concept.

FIG. 7A is a graph illustrating an output duty ratio of a triangular wave according to control of variable capacitors in a triangular wave generator of the inventive concept.

Referring to FIG. 7A, a vertical axis may indicate an output duty ratio, and a vertical axis may indicate a capacity of a capacitor. Herein, assuming that Q is a square wave signal, it may be an output duty ratio of a square wave signal.

When a triangular wave generator is configured such that a capacitance unit includes variable capacitors Cpcap and Cncap, charge capacities of the variable capacitors Cpcap and Cncap may be varied. Herein, as described with reference to FIGS. 3A to 3D, a charge capacity may be varied by changing a level of a capacitance control signal applied to the variable capacitors Cpcap and Cncap or by using capacitors having different capacities.

In the triangular wave generator, an output duty ratio of a triangular wave signal TRI may increase in proportion to an increase in charge capacities of the variable capacitors Cpcap and Cncap. Herein, a duty ratio of the triangular wave signal TRI of the triangular wave generator may be about 13% to 54%.

For example, when charge capacities of the variable capacitors Cpcap and Cncap are about 10 um$^2$, a duty ratio of the triangular wave signal TRI may be about 30%. When charge capacities of the variable capacitors Cpcap and Cncap are about 40 um$^2$, a duty ratio of the triangular wave signal TRI may be about 54%.

In the triangular wave generator, an output duty ratio of a triangular wave signal TRI may decrease in proportion to a decrease in charge capacities of the variable capacitors Cpcap and Cncap.

Figure 7B:
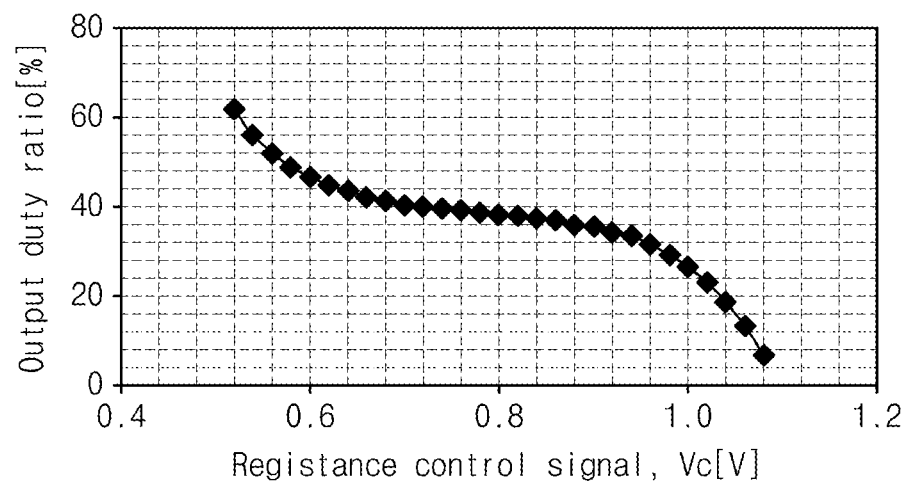
FIG. 7B is a graph illustrating an output duty ratio of a triangular wave according to control of a resistance control signal in a triangular wave generator of the inventive concept.

FIG. 7B is a graph illustrating an output duty ratio of a triangular wave according to control of a resistance control signal in a triangular wave generator of the inventive concept.

Referring to FIG. 7B, when a triangular wave generator is configured such that a resistance unit includes a transistor Tr, a resistance control signal Vc1 applied to the transistor Tr may be varied.

In the triangular wave generator, an output duty ratio of a triangular wave signal TRI may decrease when a voltage of the resistance control signal Vc1 increases. Herein, a duty ratio of the triangular wave signal TRI of the triangular wave generator may be about 7% to 60%.

For example, when the resistance control signal Vc1 has a voltage of 0.6V, a duty ratio of the triangular wave signal TRI may be about 46%. When the resistance control signal Vc1 has a voltage of 1V, a duty ratio of the triangular wave signal TRI may be about 27%.

In the triangular wave generator, an output duty ratio of a triangular wave signal TRI may increase when a voltage of the resistance control signal Vc1 decreases.

Figure 7C:
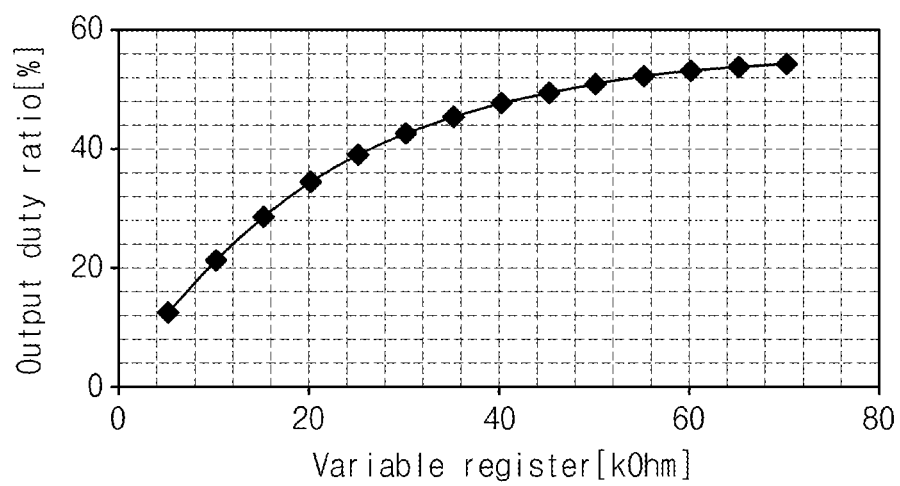
FIG. 7C is a graph illustrating an output duty ratio of a triangular wave according to control of a value of a variable resistor in a triangular wave generator of the inventive concept.

FIG. 7C is a graph illustrating an output duty ratio of a triangular wave according to control of a value of a variable resistor in a triangular wave generator of the inventive concept.

Referring to FIG. 7C, when a triangular wave generator is configured such that a resistance unit includes a variable resistor Rv, a value of the variable resistor Rv may be controlled by a resistance control signal Vc1.

In the triangular wave generator, an output duty ratio of a triangular wave signal TRI may increase when a value of the variable resistor Rv increases. Herein, a duty ratio of the triangular wave signal TRI of the triangular wave generator may be about 13% to 54%.

For example, when the variable resistor Rv has a resistance value of 20Ω, a duty ratio of the triangular wave signal TRI may be about 34%. When the variable resistor Rv has a resistance value of 60KΩ, a duty ratio of the triangular wave signal TRI may be about 53%.

In the triangular wave generator, an output duty ratio of a triangular wave signal TRI may decrease when a value of the variable resistor Rv decreases.

The triangular wave generator of the inventive concept may change capacitance values of variable capacitors Cpcap and Cncap and a value of a variable resistor (a resistor varied according to a resistance control signal Vc1 applied to a gate of a transistor Tr or a variable resistor Rv) to control charging/discharging points of time.

In FIGS. 7A to 7C, it is possible to generate a square wave signal with a wide duty ratio using a signal Q1 and a signal Qb or Q2 obtained by inverting the signal Q1. In this case, a duty ratio of a square wave signal may be about 13% to 87% in case of FIG. 7A, about 7% to 93% in case of FIG. 7B, and about 13% to 87% in case of FIG. 7C.

Figure 8:
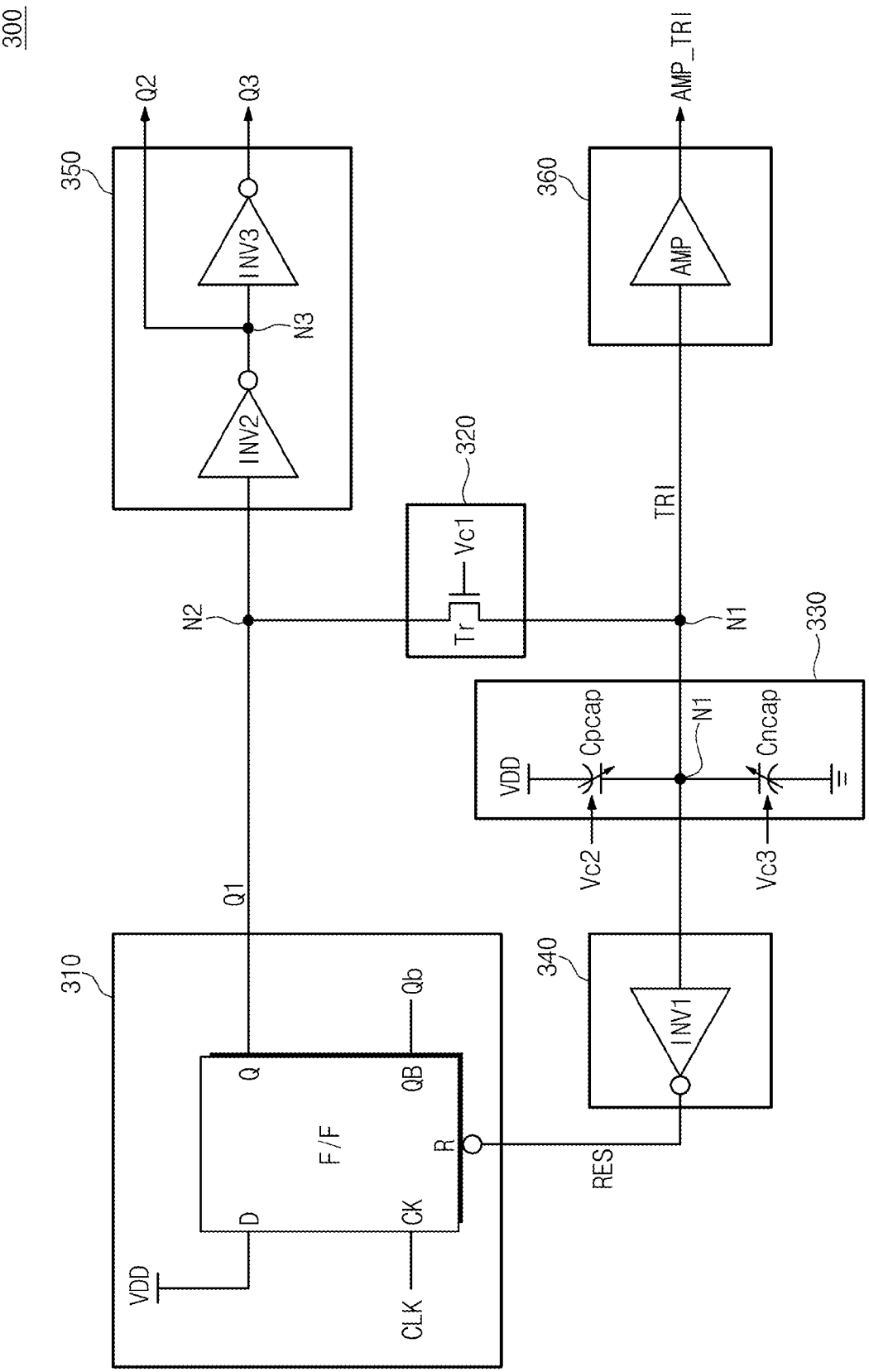
FIG. 8 is a block diagram schematically illustrating a triangular wave generator according to still another embodiment of the inventive concept.

FIG. 8 is a block diagram schematically illustrating a triangular wave generator according to still another embodiment of the inventive concept.

Referring to FIG. 8, a triangular wave generator 300 may include a square wave signal generator 310, a resistance unit 320, a capacitance unit 330, an inverter unit 340, a buffer unit 350, and an amplification unit 360.

The elements 310, 320, 330, and 340 illustrated in FIG. 8 may be substantially the same as illustrated in FIG. 5, and description thereof is thus omitted.

The inverter unit 340 may include a first inverter INV1.

The buffer unit 350 may be connected to a first node N1. The buffer unit 350 may buffer a signal of the first node N1, that is, a square wave signal Q1. The buffer unit 350 may include a second inverter INV2 and a third d inverter INV3.

The second inverter INV2 may invert the square wave signal Q1 input via a second node N2 to output a first inverting signal Q2 to a third node N3.

The second node N2 may be a connection node between the square wave signal generating unit 310 and the resistance unit 320, and the third node N3 may be a connection node between the second inverter INV2 and the third inverter INV3.

The third inverter INV3 may invert the first inverting signal Q2 to output a second inverting signal Q3. In example embodiments, the buffer unit 350 may be optionally included in a triangular wave generator 200 to output inverting signals Q2 and Q3 using inverters INV2 and INV3.

The amplification unit 360 may be connected to an output node N1 of the triangular wave generator 300, and may amplify a triangular wave signal TRI.

The amplification unit 360 may include an amplifier AMP, for example. In this case, the amplifier AMP may amplify the triangular wave signal TRI to have a desired level, and may output an amplified triangular wave signal AMP_TRI.

In example embodiments, a triangular wave generator 100 in FIG. 1 can be configured to include the buffer unit 350 and the amplification unit 360.

Triangular wave generators according to the inventive concept may generate a triangular wave signal that exponentially increases according to a time constant. Herein, the time constant may be determined by a result obtained by multiplying a resistance value according to the control of a signal level of a resistance unit and a capacitance value of a capacitance unit. To generate a triangular wave signal TRI having a more linear waveform, the triangular wave generators according to the inventive concept may be configured such that the time constant is five or more times larger than a period of a clock signal CLK.

In the triangular wave generators according to the inventive concept, as a period of a clock signal CLK becomes larger, a more linear waveform may be obtained. At this time, a duty ratio of a square wave signal Q1 may be about 50%. While operating according to a frequency of the clock signal CLK, the triangular wave generators according to the inventive concept may generate a triangular wave signal having a duty ratio of 50% regardless of a duty ratio of the clock signal CLK. The triangular wave generators according to the inventive concept may be used as a clock correcting circuit such as a frequency multiplier or a phase locked loop. At this time, if a time constant time is below five times a period of the clock signal CLK, a difference may be generated between a charge time and a discharge time. This may enable a triangular wave signal TRI to have various duty ratios regardless of a duty ratio of the clock signal CLK.

Further, the triangular wave generators according to the inventive concept may generate a triangular wave signal TRI and modify a pulse width of the triangular wave signal TRI variously. Thus, the triangular wave generators according to the inventive concept are applicable to a motor driving circuit, a frequency synthesizer, and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A triangular wave generator comprising:
    a square wave signal generating unit configured to output a
        first signal transitioning to a high level from a low level via an output terminal in response to a first transition of a clock signal input via a clock terminal and to transition the first signal to a low level from a high level in response to a reset signal input via a reset terminal to output a square wave signal via an output terminal;

a resistance unit configured to adjust a voltage level of a signal of the output terminal; and a capacitance unit configured to receive an output signal of the resistance unit to generate a second signal rising to a high level from a low level with a slope, to provide the reset signal generated from the second signal to the square wave signal generating unit, and to output a triangular signal by falling the second signal to a low level from a high level with a slope.

2. The triangular wave generator of claim 1, wherein the square wave signal generating unit further includes an input terminal supplied with a power supply voltage.

3. The triangular wave generator of claim 2, wherein the square wave signal generating unit includes the clock terminal, the input terminal, the reset terminal, and the output terminal.

4. The triangular wave generator of claim 1, wherein the resistance unit includes a transistor having a drain connected to the square wave signal generating unit, a source connected to the capacitance unit, and a gate connected to receive a first control signal.

5. The triangular wave generator of claim 1, wherein the resistance unit includes a variable resistor controlling a voltage level of the square wave signal in response to a first control signal.

6. The triangular wave generator of claim 1, wherein the capacitance unit includes at least one capacitor connected to the output terminal outputting the triangular signal.

7. The triangular wave generator of claim 6, wherein the capacitance unit comprises:

a first capacitor connected to the output terminal and a power terminal and configured to charge and discharge a voltage-controlled square wave signal in response to a second control signal; and a second capacitor connected to the output terminal and a ground terminal and configured to charge and discharge the voltage-controlled square wave signal in response to a third control signal.

8. The triangular wave generator of claim 6, wherein the capacitance unit comprises:

a plurality of capacitors connected in parallel between the output terminal and a power terminal and configured to charge and discharge a voltage-controlled square wave signal; and at least one switch connected to a part of the plurality of capacitors, respectively, and configured to control a charge capacity in response to a switch control signal.

9. The triangular wave generator of claim 6, wherein the capacitance unit comprises:

a plurality of capacitors connected in parallel between the output terminal and a ground terminal and configured to charge and discharge a voltage-controlled square wave signal; and at least one switch connected to a part of the plurality of capacitors, respectively, and configured to control a charge capacity in response to a switch control signal.

10. The triangular wave generator of claim 1, further comprising:

an inverter unit placed between the capacitance unit and the square wave signal generating unit and configured to invert the second signal to generate the reset signal.

11. The triangular wave generator of claim 1, further comprising:

a buffer unit configured to receive the square wave signal and to invert the square wave signal to output at least one inverting signal.

12. The triangular wave generator of claim 11, wherein the buffer unit comprises:

a first inverter configured to receive the square wave signal and to invert the square wave signal to output a first inverting signal; and a second inverter configured to receive the first inverting signal and to invert the first inverting signal to output a second inverting signal.

13. The triangular wave generator of claim 1, further comprising:

an amplification unit configured to amplify and output the triangular signal.

14. A triangular wave generating method of a triangular wave generator which includes a square wave signal generating unit has an input terminal, a clock terminal, a reset terminal, and an output terminal, the triangular wave generating method comprising:

outputting a first signal transitioning to a high level from a low level via the output terminal in response to a first transition of a clock signal input via the clock terminal;

receiving the first signal to generate a second signal rising to a high level from a low level with a slope;

receiving the second signal to generate a reset signal;

transitioning the first signal to a low level from a high level in response to the reset signal via the reset terminal to output the square wave signal via the output terminal; and receiving the square wave signal and outputting a triangular signal by falling the second signal to a low level from a high level with a slope.

15. The triangular wave generating method of claim 14, wherein the reset signal is generated using the second signal which has a voltage level adjusted by a first control signal.

16. The triangular wave generating method of claim 14, wherein the triangular signal is output using the square wave signal which has a voltage level controlled by a first control signal.

* * * * *